(12) United States Patent  (10) Patent No.: US 7,398,506 B2
Kanamoto et al.  (45) Date of Patent: Jul. 8, 2008

(54) NET LIST PRODUCING DEVICE PRODUCING A NET LIST WITH AN INTERCONNECTION PARASITIC ELEMENT BY HIERARCHICAL PROCESSING

(75) Inventors: Toshiki Kanamoto, Tokyo (JP); Mitsutoshi Shirota, Tokyo (JP); Michiko Uchimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 334 days.

(21) Appl. No.: 11/358,101

(22) Filed: Feb. 22, 2006

(65) Prior Publication Data
US 2006/0190898 A1   Aug. 24, 2006

(30) Foreign Application Priority Data
Feb. 24, 2005   (JP) ............................. 2005-048775

(51) Int. Cl.
*G06F 17/50* (2006.01)
(52) U.S. Cl. .............................. 716/18; 716/11; 716/12; 716/17
(58) Field of Classification Search .................. 716/11, 716/12, 17, 18
See application file for complete search history.

(56) References Cited

U.S. PATENT DOCUMENTS 6,865,726 B1 * 3/2005 Igusa et al. .................... 716/18

FOREIGN PATENT DOCUMENTS

JP       2004-94402 A       3/2004

* cited by examiner

*Primary Examiner*—Thuan Do
(74) *Attorney, Agent, or Firm*—McDermott Will & Emery LLP

(57) ABSTRACT

A memory cell information producing unit obtains physical terminal coordinates, physical terminal names and logical terminal names of a memory cell and layout data, and operates based on them to specify parasitic elements parasitic on interconnections of the memory cell, and to produce memory cell information including the physical terminal names and representing physical properties and a connection relationship of inner elements of the memory cell and the parasitic elements. Memory cell array information producing unit obtains connection information determining the connection relationship of physical terminals of the memory cell, assigns node names to the physical terminals of the memory cell based on the connection information, and produces memory cell array information representing the node names of all the memory cells. A memory cell array net list producing unit produces a net list of the memory cell array formed of the memory cell information and the memory cell array information.

5 Claims, 19 Drawing Sheets

```
subckt A , wl , wr , bt , bu , lbt , lbu
M1      net1 , net3 , net10 , w , l ···
 ⋮       ⋮      ⋮       ⋮
R1      wl   , net1 , 2Ω
R2      net1 , net2 , 1Ω
 ⋮       ⋮      ⋮       ⋮
R9      net4 , lbu  , 3Ω
C1      wl   , grd  , 1fF
C2      net1 , grd  , 4fF
 ⋮       ⋮      ⋮       ⋮
C10     lbu  , grd  , 3fF
ends
```

FIG.9

```
subckt X , ...
XI0      N0   , N1     , NL     , N(L+64) , NJ     , N(J+64) , A
XI1      N1   , N2     , N(L+1) , N(L+65) , N(J+1) , N(J+65) , A
  ⋮       ⋮       ⋮        ⋮        ⋮        ⋮        ⋮       ⋮
XI63     N63  , N64    , N(L+63), N(L+127), N(J+63), N(J+127), A
  ⋮       ⋮       ⋮        ⋮        ⋮        ⋮        ⋮       ⋮
XII      NJ   , N(J+1) , NP     , N(P+1)  , NQ     , N(Q+1)  , A
XI(I+64) N(J+2), N(J+3), N(P+1) , N(P+2)  , N(Q+1) , N(Q+2)  , A
  ⋮       ⋮       ⋮        ⋮        ⋮        ⋮        ⋮       ⋮
ends
```

FIG.10

```
subckt X , ···
XI0      N0   , N1      , NL      , N(L+64) , NJ      , N(J+64)  , A
XI1      N1   , N2      , N(L+1)  , N(L+65) , N(J+1)  , N(J+65)  , A
  ⋮       ⋮      ⋮         ⋮         ⋮         ⋮         ⋮        ⋮
XI63     N63  , N64     , N(L+63) , N(L+127), N(J+63) , N(J+127) , A
  ⋮       ⋮      ⋮         ⋮         ⋮         ⋮         ⋮        ⋮
XIl      NJ   , N(J+1)  , NP      , N(P+1)  , NQ      , N(Q+1)   , A
XI(l+64) N(J+2), N(J+3) , N(P+1)  , N(P+2)  , N(Q+1)  , N(Q+2)   , A
  ⋮       ⋮      ⋮         ⋮         ⋮         ⋮         ⋮        ⋮
ends
```
← MEMORY CELL ARRAY INFORMATION

```
subckt A , wl , wr , bt , bu , lbt , lbu
M1    net1 , net3 , net10 , w , l ···
 ⋮      ⋮      ⋮      ⋮
R1    wl   , net1 , 2Ω
R2    net1 , net2 , 1Ω
 ⋮      ⋮      ⋮      ⋮
R9    net4 , lbu  , 3Ω
C1    wl   , grd  , 1fF
C2    net1 , grd  , 4fF
 ⋮      ⋮      ⋮      ⋮
C10   lbu  , grd  , 3fF
ends
```
← MEMORY CELL INFORMATION

FIG.14

```
subckt X, ···
XI0      N0   , N1    , NL     , N(L+64) , NJ     , N(J+64) ,
XI1      N1   , N2    , N(L+1) , N(L+65) , N(J+1) , N(J+65) , A
 ⋮        ⋮      ⋮       ⋮        ⋮         ⋮        ⋮       A
XI63     N63  , N64   , N(L+63), N(L+127), N(J+63), N(J+127), ⋮
 ⋮        ⋮      ⋮       ⋮        ⋮         ⋮        ⋮       A
XII      NJ   , N(J+1), NP     , N(P+1)  , NQ     , N(Q+1)  , ⋮
XI(I+64) N(J+2), N(J+3), N(P+1), N(P+2)  , N(Q+1) , N(Q+2)  , A
 ⋮        ⋮      ⋮       ⋮        ⋮         ⋮        ⋮       A
ends                                                          ⋮
```
← MEMORY CELL ARRAY INFORMATION

```
subckt A , wl , wr , bt , bu , Ibt , Ibu
M1    net1  , net3  , net10 , w ,
 ⋮      ⋮       ⋮       ⋮     ⋮
R1    wl    , net1  , 2Ω              | ···
R2    net1  , net2  , 1Ω
 ⋮      ⋮       ⋮       ⋮
R9    net4  , Ibu   , 3Ω
C1    wl    , grd   , 2fF
C2    net1  , grd   , 6fF
 ⋮      ⋮       ⋮       ⋮
C10   Ibu   , grd   , 5fF
R10   net30 , net31 , 4Ω
R11   net32 , net33 , 5Ω
 ⋮      ⋮       ⋮       ⋮
C11   net30 , grd   , 2fF
 ⋮
ends
```
← MEMORY CELL INFORMATION

FIG.16

```
subckt X, ···
XI0      N0    , N1    , NL     , N(L+64) , NJ     , N(J+64)  , A
XI1      N1    , N2    , N(L+1) , N(L+65) , N(J+1) , N(J+65)  , A
  ⋮        ⋮       ⋮        ⋮         ⋮         ⋮         ⋮
XI63     N63   , N64   , N(L+63), N(L+127), N(J+63), N(J+127) , A
  ⋮        ⋮       ⋮        ⋮         ⋮         ⋮         ⋮
XII      NJ    , N(J+1), NP     , N(P+1)  , NQ     , N(Q+1)   , A
XI(I+64) N(J+2), N(J+3), N(P+1) , N(P+2)  , N(Q+1) , N(Q+2)   , A
  ⋮        ⋮       ⋮        ⋮         ⋮         ⋮         ⋮
ends
```
← MEMORY CELL ARRAY INFORMATION

```
subckt A , wl , wr , bt , bu , lbt , lbu
M1    net1 , net3 , net10 , w , l  ···
  ⋮     ⋮      ⋮      ⋮
R1    wl   , net1 , 2Ω
R2    net1 , net2 , 1Ω
  ⋮     ⋮      ⋮      ⋮
R9    net4 , lbu  , 3Ω
C1    wl   , grd  , 2fF
C2    net1 , grd  , 6fF
  ⋮     ⋮      ⋮      ⋮
C10   lbu  , grd  , 5fF
ends
```
← MEMORY CELL INFORMATION

FIG.19

```
subckt XX
XI1 , net0 , net2 , ... , net63 , net64 , ... , net127 , net128 , ... , net19L , X
XI2 , net0 , net2 , ... , net63 , net64 , ... , net127 , net128 , ... , net191 , Y
ends
```
← MEMORY CELL ARRAY AND PERIPHERAL CIRCUIT BLOCK INFORMATION

```
subckt X , wd0 , wd1 , wd2 , ... ,wd63 , bl0 , bl1 , ... , bl63 , lbl0 , lbl1 , ... , lbl63
XI0  N0, N1, NL, N(L+64), A
  ...   ...   ...
ends
subckt A , wl , wr , bt , bu , lbt , lbu
  ...   ...   ...
ends
```
← NET LIST OF NET LIST ARRAY

```
subckt Y , wd0 , wd1 , wd2, ... ,wd63 , bl0 , bl1 , ... , bl63 , lbl0 , lbl1 , ... , lbl63
M1
 ...
R1
 ...
C1
 ...
ends
```
← NET LIST OF PERIPHERAL CIRCUIT BLOCK

NET LIST PRODUCING DEVICE PRODUCING A NET LIST WITH AN INTERCONNECTION PARASITIC ELEMENT BY HIERARCHICAL PROCESSING

BACKGROUND OF THE INVENTION

1. Field of the Invention

The present invention relates to a net list producing device, and particularly to a net list producing device producing a net list with an interconnection parasitic element by hierarchical processing.

2. Description of the Background Art

Conventionally, methods of producing a net list with an interconnection parasitic element of a small data quantity for circuit simulation have been proposed.

For example, a method in Japanese Patent Laying-Open No. 2004-094402 employs delay model producing means 4 receiving a prelayout net list 1, an LPE net list 3 of a result of extracting layout parasitic elements, and an LPE information correlating property 2 correlating LPE net list 3 and prelayout net list 1 with each other, and producing a delay model file 5 from prelayout net list 1 and LPE net list 3 according to details of LPE information correlating property 2. This method also employs delay simulation net list producing means 6 (i.e., net list producing means for a delay simulation) producing a net list 7 for a delay simulation from delay model file 5 and prelayout net list 1.

However, the method of Japanese Patent Laying-Open No. 2004-094402 has not disclosed means for producing the LPE information correlating property forming an input. The pin name (physical terminal name) described in the LPE information is present in the LPE net list, but is not present in the prelayout net list, and it is impossible to produce the delay simulation net list (i.e., net list for a net simulation) for a whole memory from information of only logical terminal names described in the prelayout net list.

According to Japanese Patent Laying-Open No. 2004-094402, therefore, it is actually impossible to produce the net list with the interconnection parasitic element of a small data quantity.

SUMMARY OF THE INVENTION

It is an object of the invention to provide a net list producing device that can produce a net list with an interconnection parasitic element of a small data quantity.

According to an aspect of the invention, a net list producing device for producing a net list with interconnection parasitic element of a second circuit formed of repetition of a first circuit includes a first circuit information producing unit obtaining a physical terminal coordinate, a physical terminal name and a logical terminal name of the first circuit and layout data, and operating, based on the obtained physical terminal coordinate, the obtained physical and logical terminal names and the obtained layout data, to specify a parasitic element parasitic on an interconnection of the first circuit, and to produce first circuit information including the physical terminal name and representing physical properties and a connection relationship of an inner element of the first circuit and the parasitic element; a second circuit information producing unit obtaining connection information determining a connection relationship of the physical terminals of all the first circuits included in the second circuit, assigning node names to the physical terminals of all the first circuits included in the second circuit based on the connection information, and producing second circuit information representing node names of all the first circuits included in the second circuit; and a second circuit net list producing unit producing a net list of the second circuit formed of the first circuit information and the second circuit information.

The net list producing device according to the invention can produce the net list with an interconnection parasitic element of a small data quantity.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates an example of memory cell array information in the first embodiment.

FIG. 10 illustrates an example of a net list of a memory cell array in the first embodiment.

FIG. 14 illustrates an example of a net list of a memory cell array produced in the second embodiment.

FIG. 16 illustrates an example of a net list of a memory cell array produced in a modification of the second embodiment.

FIG. 19 illustrates an example of a net list of a memory device produced in the third embodiment.

DESCRIPTION OF THE PREFERRED EMBODIMENTS

Embodiments of the invention will now be described with reference to the drawings.

First Embodiment

Figure 1:
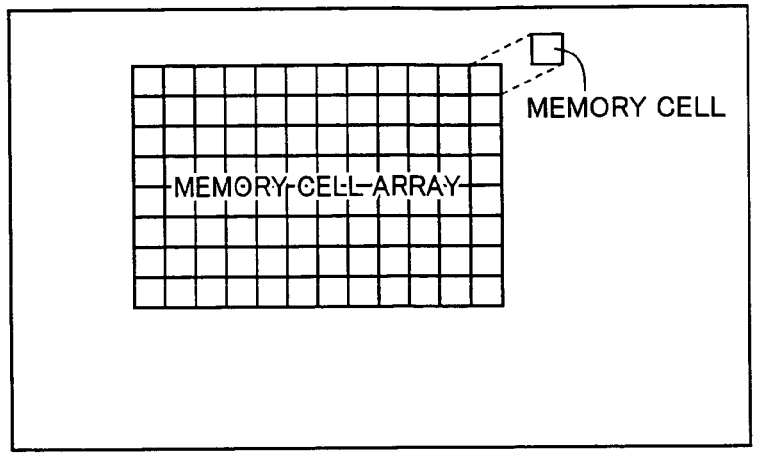
FIG. 1 shows a structure of a memory cell array.

In an embodiment of the invention, a net list with interconnection parasitic elements of a memory cell array is producing by hierarchical processing performed by utilizing the fact that the memory cell array is formed of a plurality of memory cells arranged in a repeating manner as shown in FIG. 1. Thus, interconnection parasitic elements are specified for the single memory cell, and the elements thus specified are combined together to produce the net list of the memory cell array.

The following problem arises in the hierarchical processing.

Figure 2A:
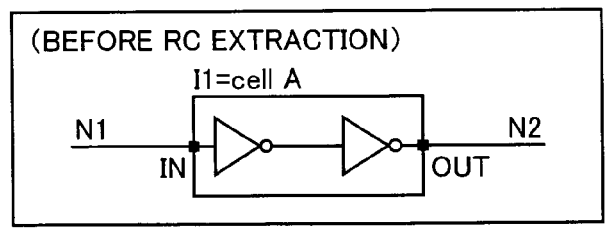
FIG. 2A shows an example of a circuit of a single memory cell before extracting an interconnection parasitic element.

FIG. 2A shows an example of a circuit of the single memory cell before extracting the interconnection parasitic element.

Figure 2B:
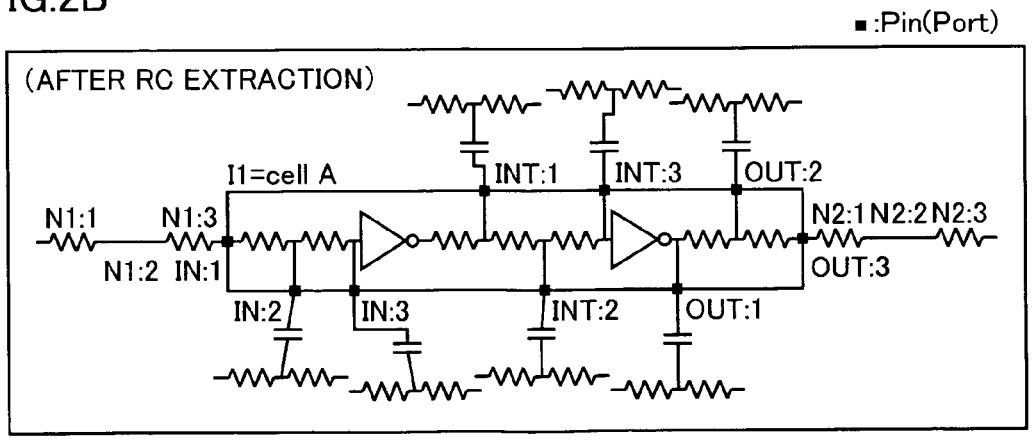
FIG. 2B is an example of the circuit of the single memory cell after extracting the interconnection parasitic element.

FIG. 2B shows an example of the circuit of the single memory cell after extracting the interconnection parasitic element.

As shown in FIG. 2B, the interconnection is divided to form nodes on the interconnections, and node names are assigned to the nodes thus formed, respectively. These node names are appropriately assigned by an LPE tool. Therefore, it is difficult to specify, from these node names, a position of the circuit before the extraction of the interconnection parasitic elements, and it is impossible to perform a circuit simulation using information of the extracted interconnection parasitic elements.

The embodiment of the invention provides a net list producing device that can overcome the above problem.

(Structure)

Figure 3:
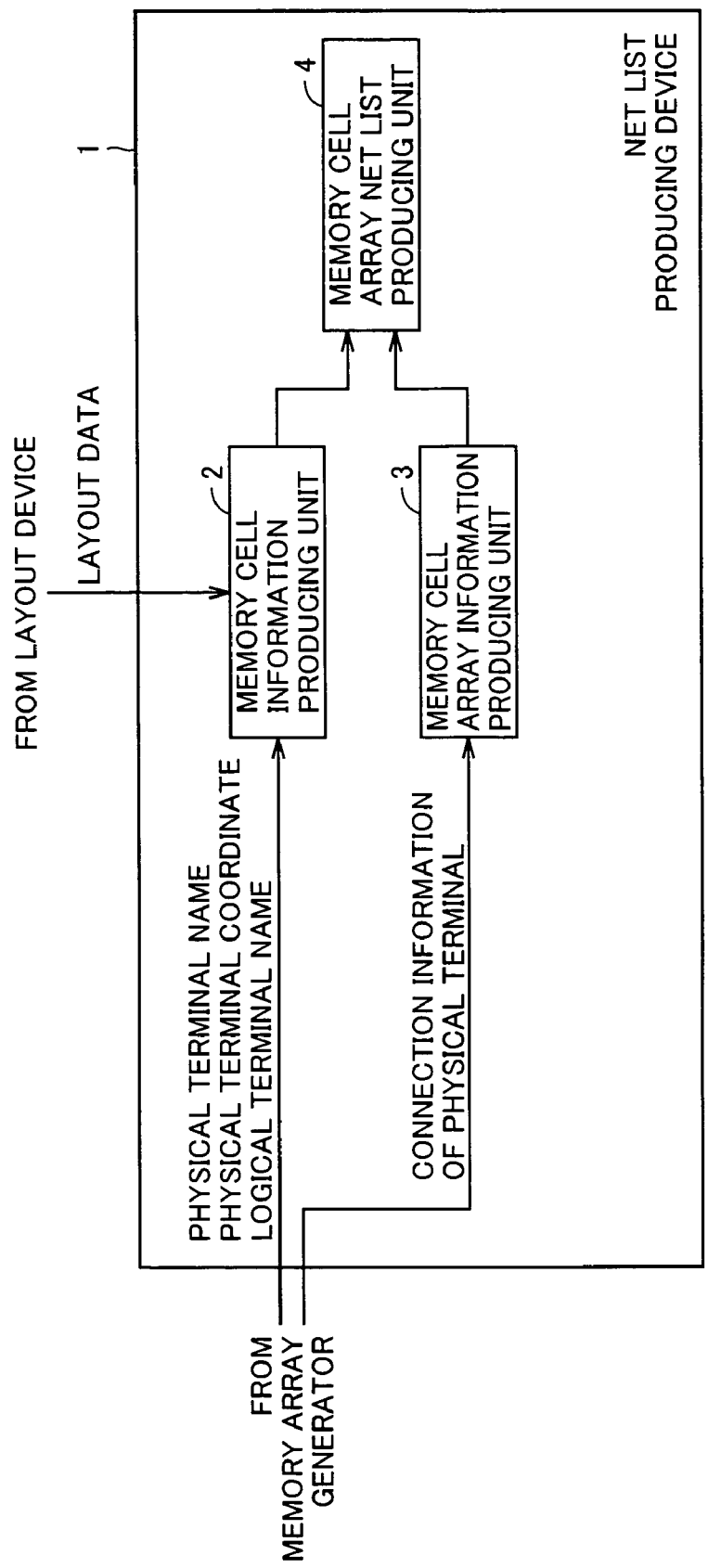
FIG. 3 is a function block diagram illustrating a structure of a net list producing device according to a first embodiment.

FIG. 3 is a function block diagram showing a structure of the net list producing device according to the first embodiment.

Referring to FIG. 3, a net list producing device 1 includes a memory cell information producing unit 2, a memory cell array information producing unit 3 and a memory cell array net list producing unit 4.

A memory array generator is employed for determining an arrangement of the memory cells in the memory cell array, and holds physical terminal names, physical terminal coordinates and logical terminal names of each memory cell.

Figure 4:
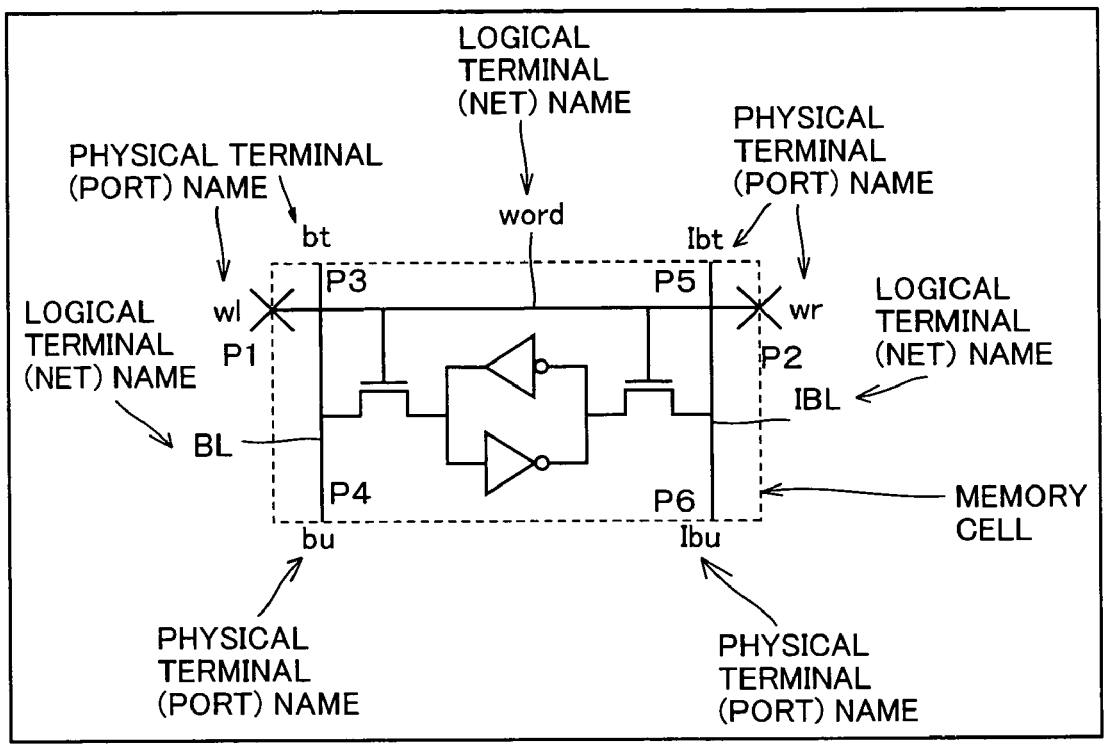
FIG. 4 illustrates by way of example logical terminal names, physical terminal coordinates and physical terminal names of the memory cell.

FIG. 4 illustrates by way of example the logical terminal names, physical terminal coordinates and physical terminal names of the memory cell.

Referring to FIG. 4, physical terminal names wl and wr correspond to the interconnection of physical terminal name "word". The physical terminal coordinate of physical terminal name wl is P1, and the physical terminal coordinate of physical terminal name wr is P2.

Physical terminal names bt and bu correspond to the interconnection of physical terminal name "BL". The physical terminal coordinate of physical terminal name bt is P3, and the physical terminal coordinate of physical terminal name bu is P4.

Physical terminal names Ibt and Ibu correspond to the interconnection of physical terminal name "IBL". The physical terminal coordinate of physical terminal name Ibt is P5, and the physical terminal coordinate of physical terminal name Ibu is P6.

Further, the memory array generator holds connection information of the physical terminals of the memory cell.

Figure 5:
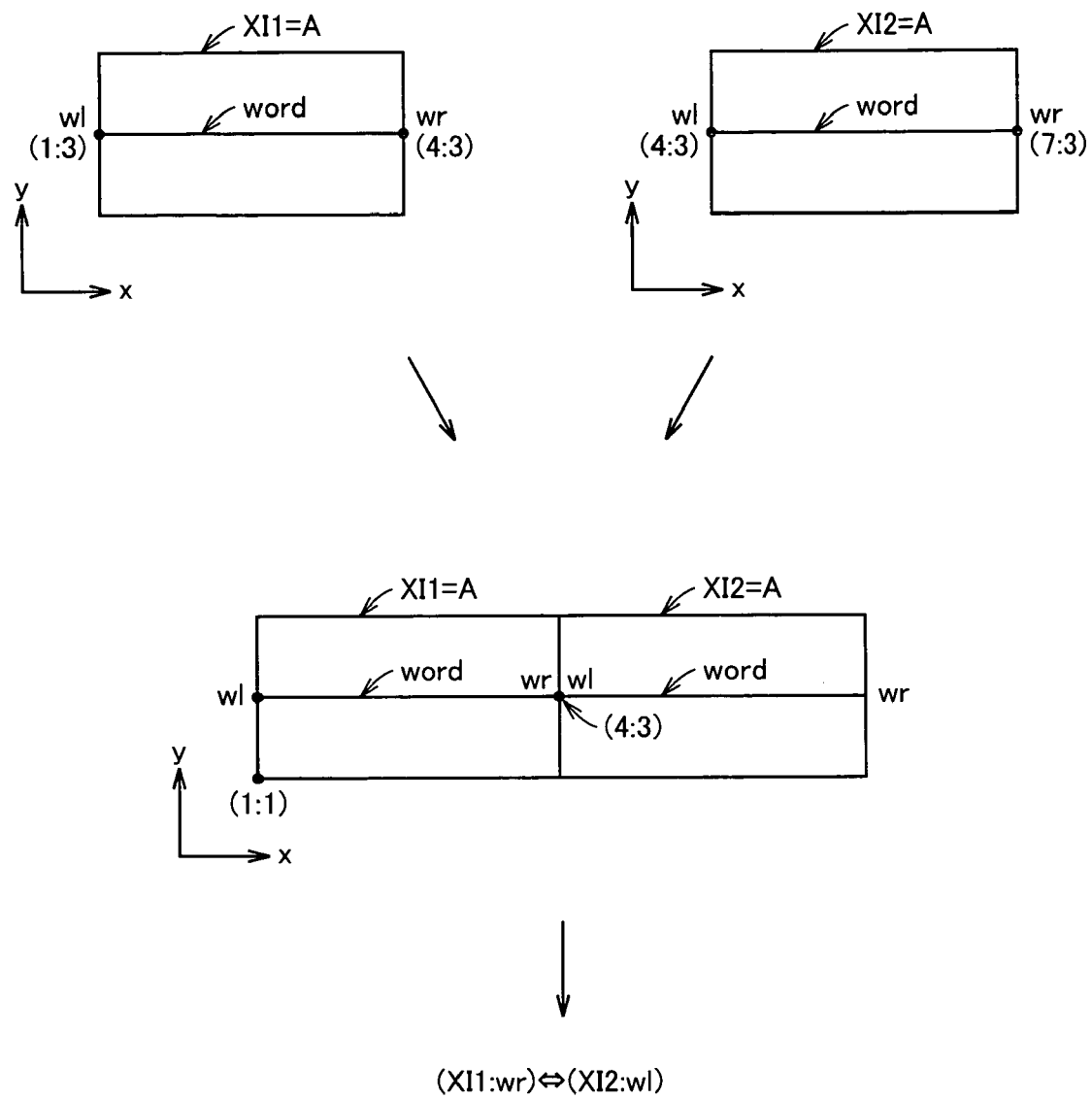
FIG. 5 illustrates processing of determining a lateral (parallel to a word line) connection relationship between memory cells.

FIG. 5 illustrates a connection relationship of the interconnection of logical terminal name "word", and thus illustrates processing of producing connection information of physical terminals of the memory cell representing the lateral (i.e., parallel to the word line) connection relationship between the memory cells.

Referring to FIG. 5, for determining the connection relationship between memory cells XI1 and XI2, physical terminal coordinates of physical terminals wl and wr of memory cell XI1 are compared with physical terminal coordinates of physical terminals wl and wr of memory cell XI2. Since the physical terminal coordinates (4, 3) physical terminal wr of memory cell XI1 are equal to physical terminal coordinate (4, 3) of physical terminal wl of memory cell XI2, connection information representing that physical terminals wr and wl of memory cells XI1 and XI2 are connected together is produced.

Figure 6:
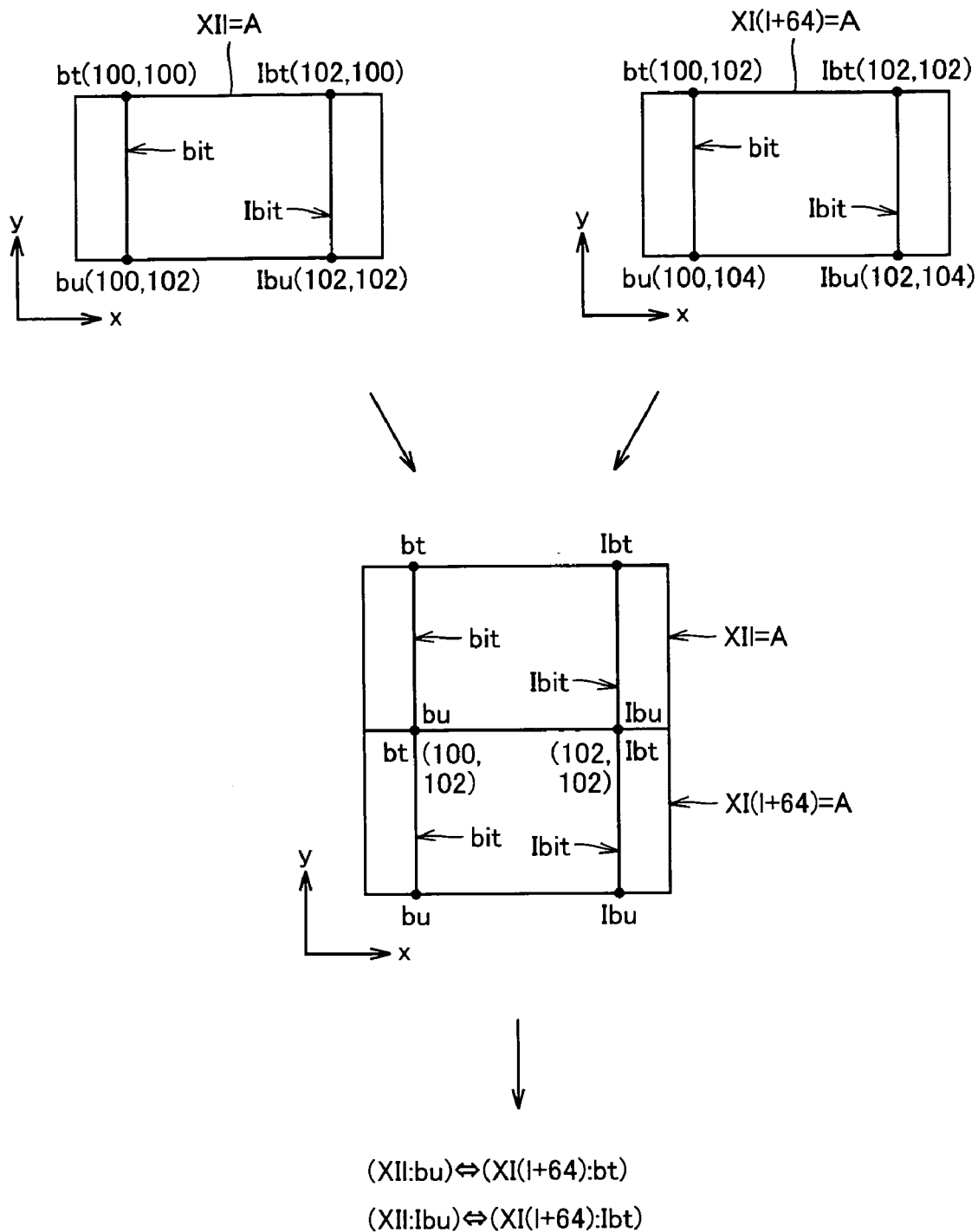
FIG. 6 illustrates processing of determining a longitudinal (parallel to a bit line) connection relationship between memory cells.

FIG. 6 illustrates a connection relationship of interconnections of logical terminal names BL and IBL, and thus illustrates processing of producing the connection information of the physical terminals of the memory cells representing the longitudinal (i.e., parallel to the bit line) between the memory cells.

Referring to FIG. 6, for determining the connection relationship between memory cells XI1 and XI2, the physical terminal coordinates of physical terminals bt and bu of memory cell XI1 are compared with the physical terminal coordinates of physical terminals bt and bu of memory cell XI2. Since physical terminal coordinates (100, 102) of physical terminal bu of memory cell XI1 are equal to physical terminal coordinates (100, 102) of physical terminal bt of memory cell XI2, the connection information representing that physical terminal bu of memory cell XI1 is connected to physical terminal bt of memory cell XI2 is produced.

Likewise, the physical terminal coordinates of physical terminals Ibt and Ibu of memory cell XI1 are compared with the physical terminal coordinates of physical terminals Ibt and Ibu of memory cell XI2. Since physical terminal coordinates (102, 102) of physical terminal Ibu of memory cell XI1 are equal to physical terminal coordinates (102, 102) of physical terminal I bt of memory cell XI2, the connection information representing that physical terminal Ibu of memory cell XI1 is connected to physical terminal Ibt of memory cell XI2 is produced.

The layout device performs the design of an arrangement of the memory cells and an arrangement of the interconnections connecting the memory cells, i.e., the layout design, and produces the layout data representing the arrangements of the memory cells and interconnections. The layout data includes the same physical terminal coordinates and logical terminal names as those held by the memory array generator.

Memory cell information producing unit 2 has a function of a so-called LPE tool. Memory cell information producing unit 2 obtains the layout data from the layout device, and obtains the physical terminal coordinates, physical terminal names and logical terminal names of one memory cell forming the memory cell array from the memory array generator. Based on the data thus obtained, memory cell information producing unit 2 specifies the parasitic elements formed of resistance components (R) and capacity components (C) which are parasitic on interconnections of the memory cell, assuming that a single memory cell is arranged. Thus, memory cell information producing unit 2 assigns the physical terminal names to positions of the layout data corresponding to the obtained physical terminal coordinates, and specifies the interconnection parasitic elements based on the layout data relating to the interconnections represented by the logical terminal names. By assigning the physical terminal names in this manner, the position of the memory cell array before extraction of the interconnection parasitic elements can be specified.

The resistance components (R) and capacity components (C) parasitic on the interconnections of the memory cell can be specified by using various known manners such as a material of the interconnections, the interconnection length, interconnection width, interconnection thickness and a distance to another interconnection.

Figures 7, 8:
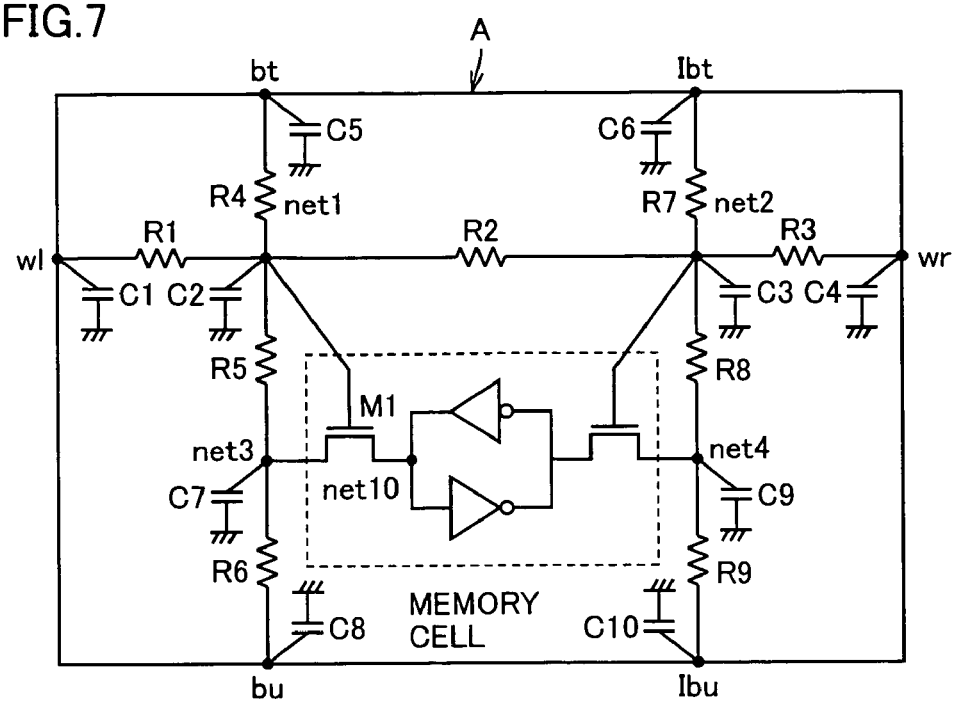
FIG. 7 illustrates interconnection parasitic elements of the memory cell in the first embodiment.
FIG. 8 illustrates an example of memory cell information in the first embodiment.

FIG. 7 represents the interconnection parasitic elements of the memory cell of the first embodiment.

Referring to FIG. 7, the interconnection of logical terminal name "word" and particularly a portion between physical terminal names wl and wr is divided at nodes net1 and net2 so that resistance components R1, R2 and R3 and capacity components C1, C2, C3 and C4 are present. In the interconnection of logical terminal name "BL", a portion between physical terminals of physical terminal names bt and bu is divided at nodes net1 and net3 so that resistance components R4, R5 and R6 and capacity components C5, C7 and C8 are present. In the interconnection of logical terminal name IBL, a portion between physical terminals of physical terminal names Ibt and Ibu is divided at net2 and net4 so that resistance components R7, R8 and R9 and capacity components C6, C9 and C10 are present.

Memory cell information producing unit 2 produces memory cell information representing physical properties (e.g., resistance values and capacity values) of the elements forming the memory cell and the specified parasitic elements as well as a connection relationship between the elements.

FIG. 8 illustrates a memory cell information of the first embodiment.

Referring to FIG. 8, resistance component R1 of the parasitic element has nodes wl and net 1, and has a resistance value of 2 ohms. Resistance component R2 of the parasitic element has nodes net1 and net2, and has a resistance value of 1 ohms. These represent that resistance components R1 and R2 are connected at node net1.

Capacity component C1 of the parasitic element has nodes wl and grd, and has a capacity value of 1 fF. Node grd represents a grounded node. Capacity component C2 has nodes net 1 and grd, and has a capacity value of 4 fF. These represent that capacity components C1 and C2 are connected together via the ground.

MOS transistor M1 forming the memory cell has nodes net1, net3 and net10, and also has a channel width of w and a channel length of 1. Other physical quantities will not be described.

Since physical terminal name wl before extraction of the interconnection parasitic element is maintained as the node name as described above, the position of the memory cell array before extraction of the interconnection parasitic element can be specified.

Memory cell array information producing unit 3 obtains the connection information of the physical terminals of all the memory cells forming the memory cell array from the memory array generator, and assigns the node names to the physical terminals of all the memory cells forming the memory cell array based on the connection information thus obtained such that the connection relationship of the physical terminals of the memory cells may be represented, i.e., such that the same node name may be assigned to the two physical terminals connected together. Memory cell array information producing unit 3 produces the memory cell array information including the node names of all the memory cells forming the memory cell array.

FIG. 9 illustrates an example of the memory cell array information in the first embodiment.

Referring to FIG. 9, a memory cell array X is formed of a plurality of sub-circuits XI0, . . . . Each sub-circuit has six nodes. These nodes correspond to physical terminals wl, wr, bt, bu, Ibt and Ibu, respectively. The entity of each sub-circuit is a memory cell A.

For example, sub-circuit XI0 has nodes N0, N1, NL, N(L+64), NJ and N(J+64), and the entity thereof is memory cell A. Sub-circuit XI1 has nodes N1, N2, N(L+1), N(L+65), N(J+1) and N(J+65), and the entity thereof is memory cell A. As described above, the same node name N1 is assigned to the node corresponding to physical terminal wr of sub-circuit XI0 and the node corresponding to physical terminal wl of sub-circuit XI1. This represents that sub-circuits XI0 and XI1 are connected together at node N1.

Likewise, sub-circuit XI1 has nodes NJ, N(J+1), NP, N(P+1), NQ and N(Q+1), and the entity thereof is memory cell A. Sub-circuit XI(I+64) has nodes N(J+2), N(J+3), N(P+1), N(P+2), N(Q+1) and N(Q+2), and the entity thereof is memory cell A. As described above, the same node name N(P+1) is assigned to the node corresponding to physical terminal bu of sub-circuit XI1 and the node corresponding to physical terminal bt of sub-circuit XI(1+64). Also, the same node name N(J+1) is assigned to the node corresponding to physical terminal Ibu of sub-circuit XI1 and the node corresponding to physical terminal Ibt of sub-circuit XI(1+64). These represent that sub-circuits XI1 and XI(1+64) are connected together at nodes N(P+1) and N(Q+1).

Memory cell array net list producing unit 4 produces the net list of the memory cell array formed of memory cell information and memory cell array information.

FIG. 10 represents an example of the net list of the memory cell array of the first embodiment.

Referring to FIG. 10, the net list of the memory cell array formed of memory cell information and memory cell array information illustrated in FIG. 6 is formed.

(Operation)

Description will now be given on an operation of the net list producing device according to the first embodiment.

Figure 11:
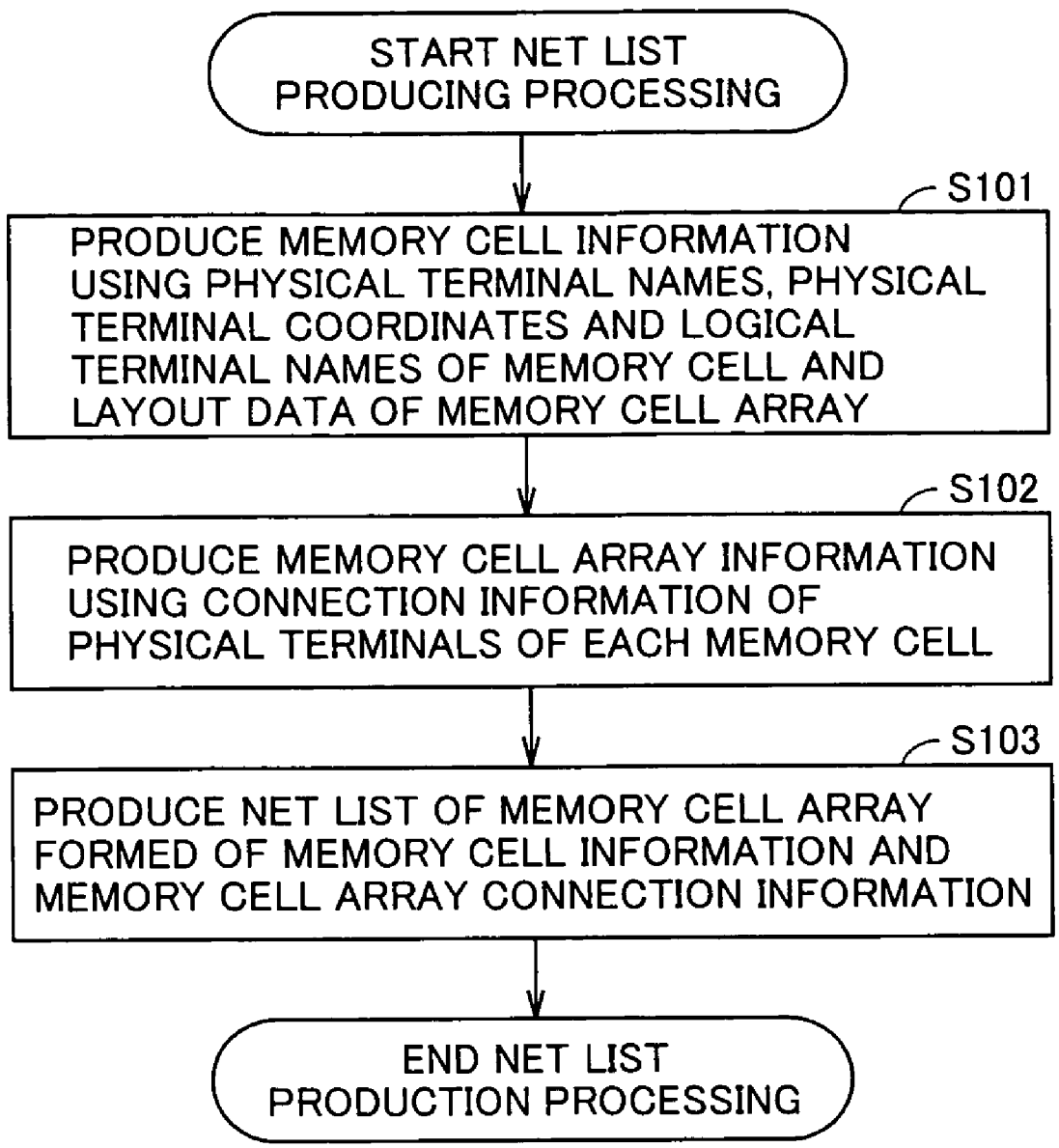
FIG. 11 is a flowchart illustrating operation steps of producing the net list of the memory cell array by a net list producing device according to the first embodiment.

FIG. 11 is a flowchart representing operation steps of producing the net list of the memory cell array by the net list producing device according to the first embodiment.

Memory cell information producing unit 2 obtains the layout data from the layout device, obtains the physical terminal coordinates, physical terminal names and logical terminal names of one memory cell forming the memory cell array from the memory array generator, and specifies, based on the data thus obtained, the parasitic elements formed of the resistance components (R) and the parasitic components (C) parasitic on the interconnections of the memory cell assuming that single memory cell is arranged. Memory cell information producing unit 2 produces the memory cell information representing the physical quantities (e.g., resistance values and capacity values) of the elements forming the memory cell and the specified parasitic elements as well as the connection relationship between the elements (step S101).

Then, memory cell array information producing unit 4 obtains the connection information of the physical terminals of all the memory cells forming the memory cell array from the memory array generator, assigns, based on the connection information thus obtained, the same node name to the connected two physical terminals, and assigns the node names to the physical terminals of all the memory cells forming the memory cell array. Memory cell array information producing unit 3 produces the memory cell array information including the node names of all the memory cells forming the memory cell array (step S102).

Then, memory cell array net list producing unit 4 produces the net list of the memory cell array formed of the memory cell information and the memory cell array information (step S103).

As described above, the net list producing device according to the first embodiment can produce the net list with the interconnection parasitic element of a small data quantity by hierarchical processing. Further, the physical terminal name obtained from the memory array generator is assigned to the physical terminal before extraction of the interconnection parasitic element so that the position of the circuit before extraction of the interconnection parasitic element can be specified.

Second Embodiment

A second embodiment relates to a net list producing device specifying interconnection parasitic elements of the memory cell including those caused by interconnections in surrounding memory cells.

(Structure)

Figure 12:
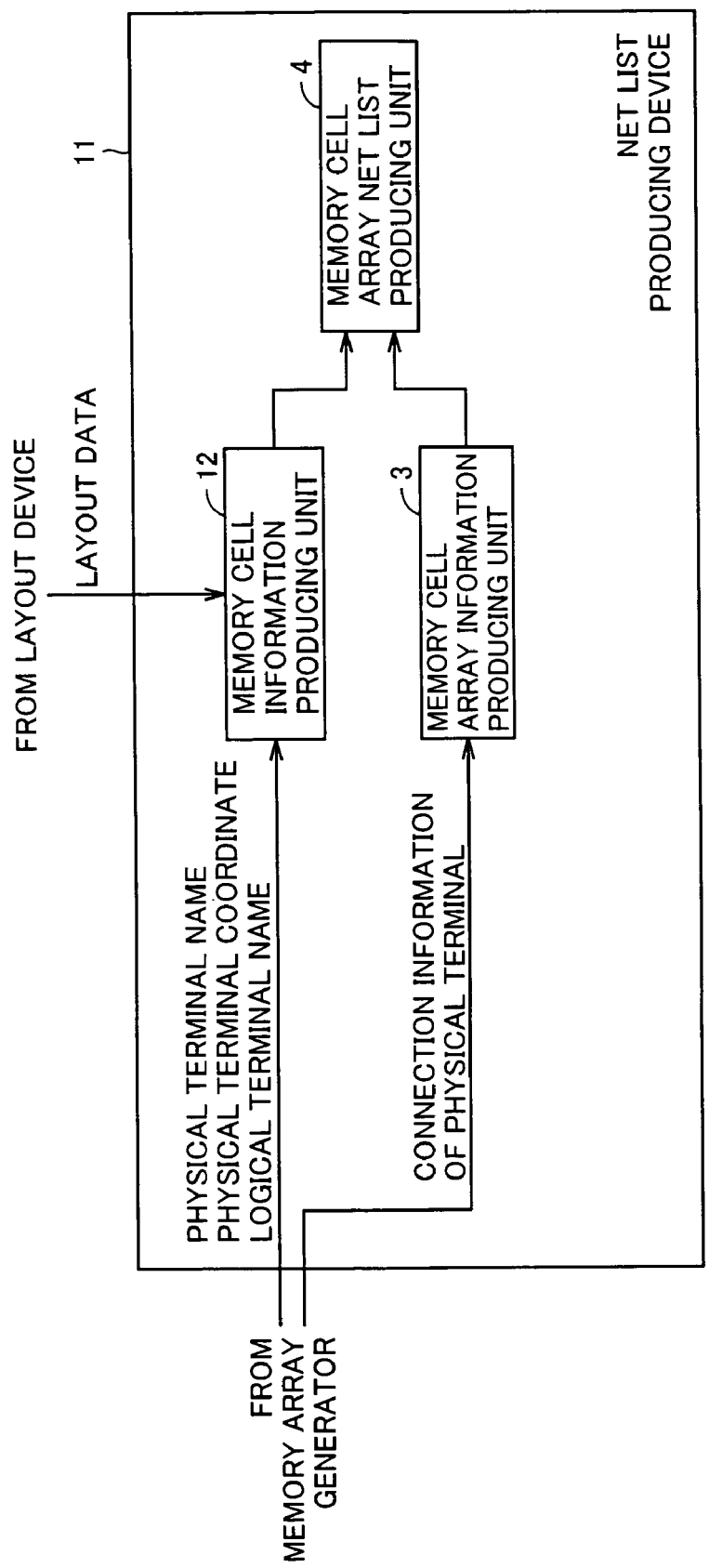
FIG. 12 is a function block diagram illustrating a structure of the net list producing device according to a second embodiment.

FIG. 12 is a function block diagram illustrating a structure of the net list producing device according to the second embodiment.

Referring to FIG. 12, a net list producing device 11 includes a memory cell information producing unit 12, memory cell array information producing unit 3 and memory cell array net list producing unit 4. In FIG. 12, the same components as those in net list producing device 1 shown in FIG. 3 bear the same reference numbers. Description will now be given on the components in FIG. 12 which are different from those in net list producing device 1 shown in FIG. 3.

Memory cell information producing unit 12 differs from memory cell information producing unit 2 of the first embodiment in that it specifies the interconnection parasitic elements of the memory cell including those caused by the interconnections in the surrounding memory cells, assuming that the memory cells are arranged around the memory cell in question.

Figure 13:
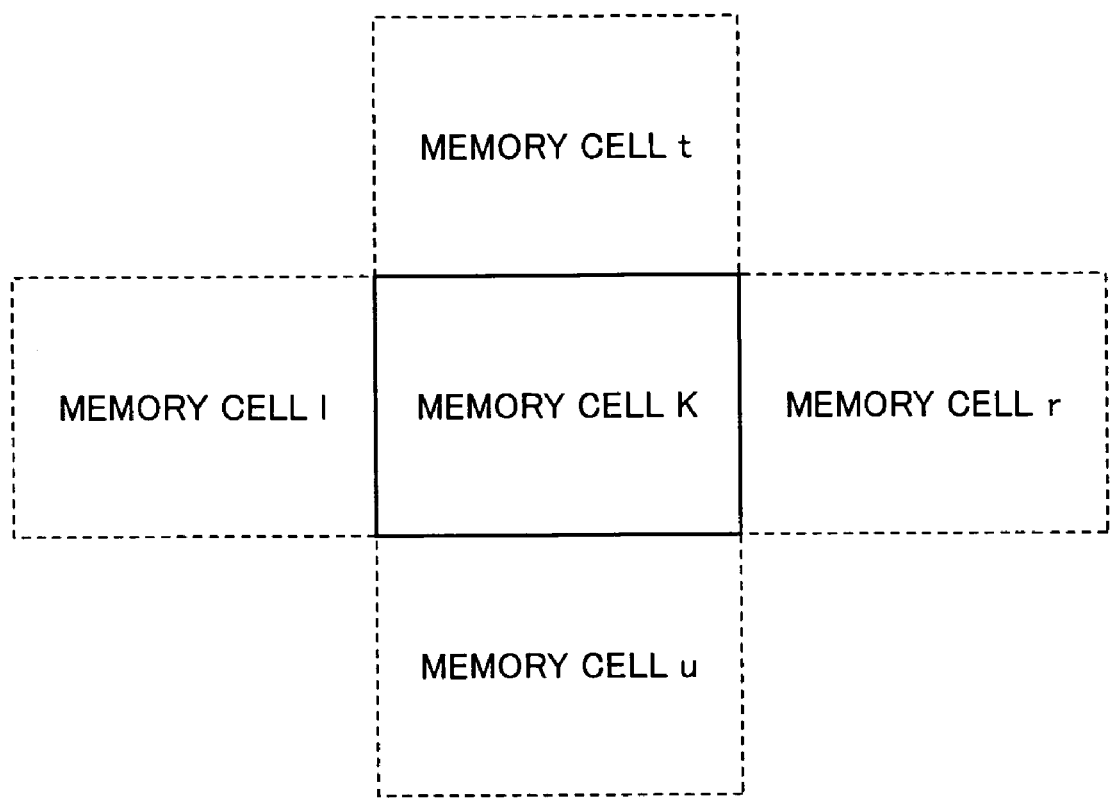
FIG. 13 illustrates a manner of determining an interconnection parasitic element of a memory cell in the second embodiment.

FIG. 13 illustrates a manner of specifying the interconnection parasitic elements of the memory cell in the second embodiment.

Referring to FIG. 13, when the interconnection parasitic elements of the memory cell are to be specified, the interconnection parasitic elements of one memory cell K represent the interconnection parasitic elements of all the memory cells. The interconnection parasitic elements of memory cell K include the interconnection parasitic elements occurring between the plurality of interconnections in memory cell K, and the interconnection parasitic elements occurring with respect to the interconnections of surrounding memory cells t, u, l and r.

FIG. 14 represents an example of the net list of the memory cell array produced in the second embodiment.

Referring to FIG. 14, the net list of the memory cell array is formed of the memory cell array information and the memory cell information.

The memory cell array information in FIG. 14 is the same as that in FIG. 10 of the first embodiment.

The memory cell information in FIG. 14 includes the memory cell information which is the same as that in FIG. 10 of the first embodiment, i.e., the information of the interconnection parasitic elements occurring between the plurality of interconnections in memory cell K, and additionally includes the information relating to the parasitic elements represented by resistance components R10, R11, . . . and capacity components C1, . . . , i.e., the information relating to the parasitic elements occurring between the interconnections in memory cell K and the interconnections in surrounding memory cells t, u, l and r.

(Operation)

Description will now be given on an operation of the net list producing device according to the second embodiment.

Figure 15:
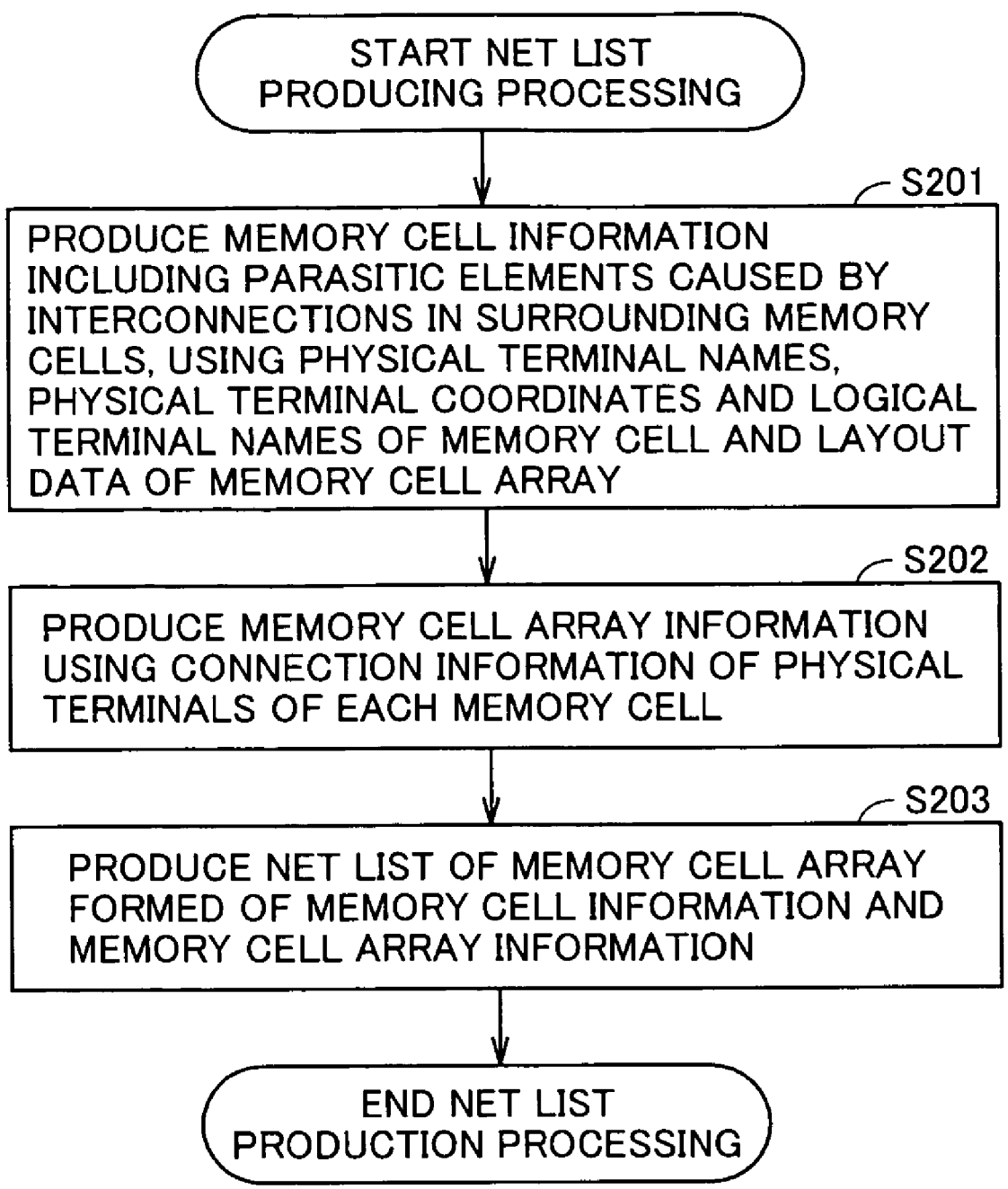
FIG. 15 is a flowchart illustrating operation steps of producing the net list of the memory cell array by a net list producing device according to the second embodiment.

FIG. 15 is a flowchart representing operation steps of producing the net list of the memory cell array by the net list producing device according to the second embodiment.

Memory cell information producing unit 12 obtains the layout data from the layout device, obtains the physical terminal coordinates, physical terminal names and logical terminal names of one memory cell forming the memory cell array from the memory array generator, and specifies, based on the data thus obtained, the parasitic elements formed of the resistance components (R) and parasitic components (C) parasitic on the interconnections of the memory cell, and include parasitic components caused by the interconnections in the surrounding memory cells, assuming that the memory cells are arranged around the memory cell in question. The memory cell information producing unit 12 produces the memory cell information representing the physical quantities (e.g., resistance values and capacity values) of the elements forming the memory cell and the specified parasitic elements as well as the connection relationship between the elements (step S201).

Then, memory cell array information producing unit 3 obtains the connection information of the physical terminals of all the memory cells forming the memory cell array from the memory array generator, assigns, based on the connection information thus obtained, the same node name to the connected two physical terminals, and assigns the node names to the physical terminals of all the memory cells forming the memory cell array. Memory cell array information producing unit 3 produces the memory cell array information including the node names of all the memory cells forming the memory cell array (step S202).

Then, memory cell array net list producing unit 4 produces the net list of the memory cell array formed of the memory cell information and the memory cell array information (step S203).

As described above, the net list producing device according to the second embodiment of the invention can produce the information about the parasitic elements in consideration of even the parasitic elements occurring with respect to the interconnections of the surrounding memory cells.

Modification of Second Embodiment

This modification relates to the production of the information about the parasitic elements in the second embodiment.

In this modification, the information about the interconnection parasitic elements of the memory cell is produced by specifying the interconnection parasitic elements of the memory cell including those caused by the interconnections in the surrounding memory cells based on the assumption that the memory cells are arranged around the memory cell in question, similarly to the second embodiment. In this modification, however, memory cell information producing unit 12 specifies the interconnection parasitic elements of the memory cell caused by the interconnections in the surrounding memory cells based on the assumption that the interconnections in the surrounding memory cells are grounded.

FIG. 16 illustrates an example of the net list of the memory cell array produced according to the modification of the second embodiment.

Referring to FIG. 16, the net list of the memory cell array is formed of the memory cell array information and the memory cell information.

The memory cell array information in FIG. 16 is the same as the memory cell array information in FIG. 10 of the first embodiment.

The memory cell information in FIG. 16 has the same structure (i.e., the numbers of resistance components and capacity components as well as the connection relationship between them) as the memory cell information in FIG. 10 of the first embodiment. However, the capacity values of capacities $C1, C2, \ldots C10$ in FIG. 16 are larger than the capacity values of capacities $C1, C2, \ldots C10$ of the first embodiment in FIG. 10, respectively. This is because the interconnections connected to the ground are increased in number.

According to the modification of the second embodiment, as described above, the information about the parasitic elements can be produced in consideration of even the parasitic elements occurring with respect to the interconnections of the surrounding memory cells, similarly to the second embodiment. Further, according to this modification, the information about the parasitic elements of the memory cell in the memory cell information has the same structure as the information about the parasitic elements of the memory cell in the first embodiment.

Third Embodiment

The third embodiment relates to a net list producing device producing a net list of a memory device having a peripheral circuit block and a memory cell array.

(Structure)

Figure 17:
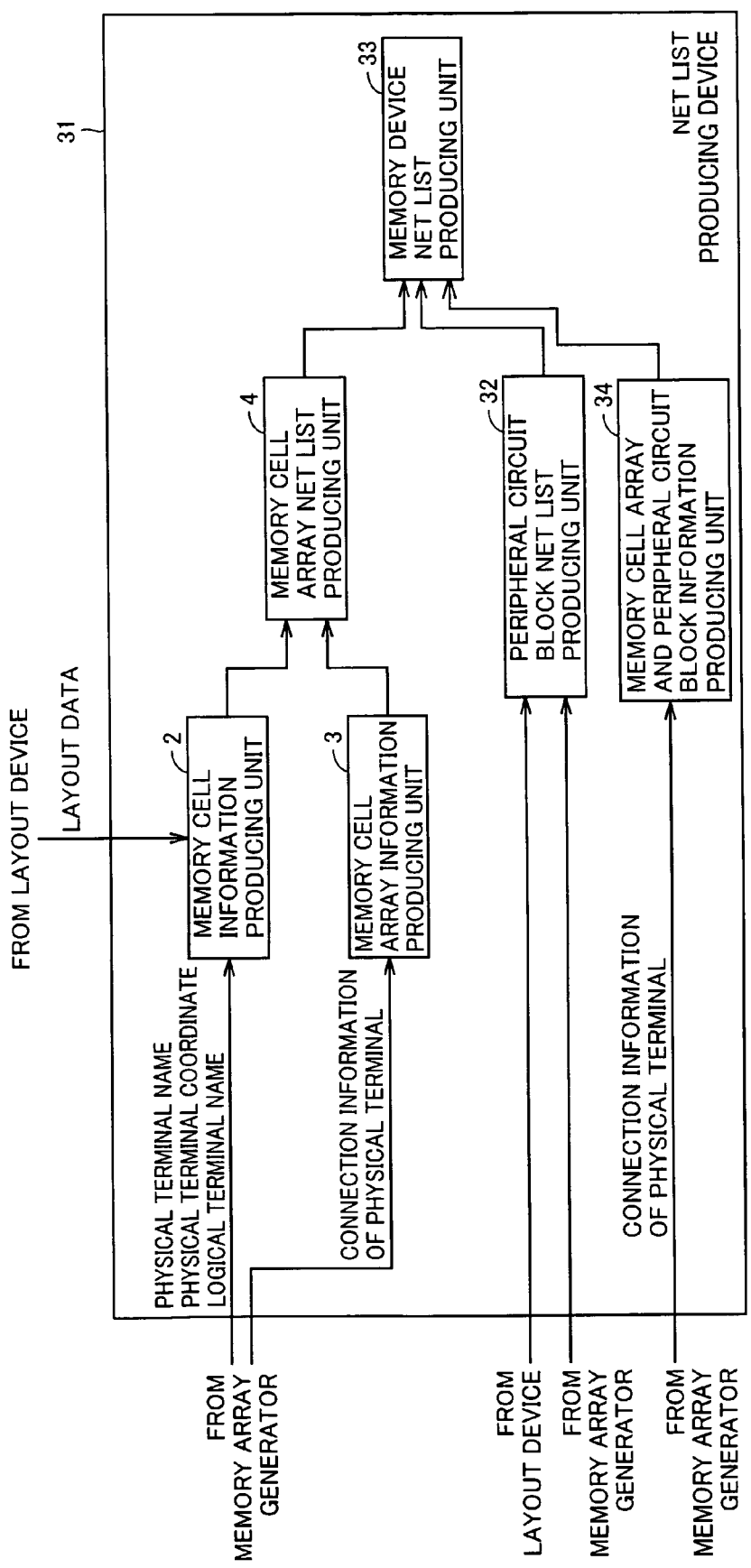
FIG. 17 is a function block diagram illustrating a structure of a net list producing device according to a third embodiment.

FIG. 17 is a function block diagram showing a structure of the net list producing device according to the third embodiment.

Referring to FIG. 17, a net list producing device 31 includes memory cell information producing unit 2, memory cell array information producing unit 3, memory cell array net list producing unit 4, a peripheral circuit block net list producing unit 32, a memory cell array and peripheral circuit block information producing unit 34 and a memory device net list producing unit 33.

In FIG. 17, the same components as those of net list producing device 1 shown in FIG. 3 bear the same reference numbers, respectively. Among the components in FIG. 17, the components different from those of net list producing device 1 in FIG. 3 will now be described.

Peripheral circuit block net list producing unit 32 produces the net list of the peripheral circuit block without performing hierarchical processing. This is because the peripheral circuit block is not formed of repetition of a circuit such as a memory cell in contrast to the memory cell array.

Memory cell array and peripheral circuit block information producing unit 34 obtains connection information about the physical terminals of the memory cell array and the physical terminals of the peripheral circuit block from the memory array generator, and assigns, based on the connection information thus obtained, the node names to the physical terminals of the memory cell array and the physical terminals of the peripheral circuit block such that the connection relationship between the physical terminals of the memory cell array and the physical terminals of the peripheral circuit block may be represented, i.e., such that the same node name may be assigned to the connected two physical terminals. Memory cell array and peripheral circuit block information producing unit 34 produces the memory cell array and peripheral circuit block information formed of the node names of the memory cell array and the node names of the peripheral circuit block.

Figure 18:
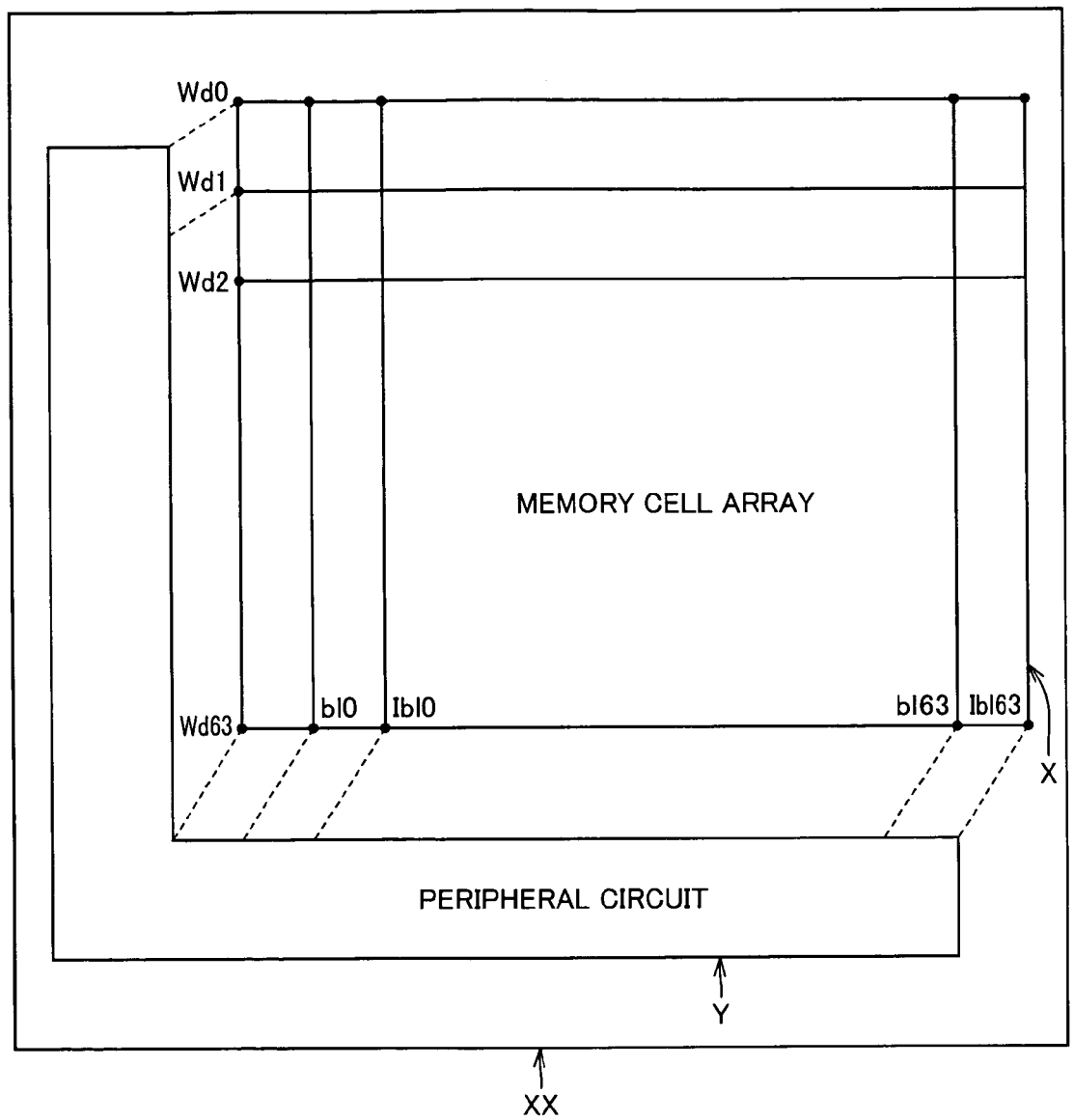
FIG. 18 illustrates a connection relationship between a memory cell array and a peripheral circuit block.

FIG. 18 represents the connection relationship between the memory cell array and the peripheral circuit block.

Referring to FIG. 18, the memory cell array and the peripheral circuit block are connected together via physical terminals wd0, wd1, wd2, . . . wd63 for connection of the word lines, and physical terminals bl0, . . . bl63 for connection of one kind of bit lines in the bit line pairs and physical terminals Ibl0, . . . bl63 for connection of the other kind of bit lines in the bit line pairs. Memory cell array and peripheral circuit block information producing unit 34 obtains the connection information about these physical terminals.

Memory device net list producing unit 33 produces the net list of the memory cell device formed of the net list of the peripheral circuit block and the memory cell array and peripheral circuit block information.

FIG. 19 represents an example of the net list of the memory device produced in the third embodiment.

Referring to FIG. 19, the net list of the memory device is formed of the memory cell array and peripheral circuit block information, the memory cell array net list and the peripheral circuit block net list.

A memory device XX is formed of a memory cell array XI1 and a peripheral circuit block XI2 each of which is a sub-circuit. Each of sub-circuits XI1 and XI2 has 192 nodes. These nodes corresponds to physical terminals wd0, wd1, wd2, . . . , wd63, bl0, . . . , bl63, Ibl0, . . . Ibl63, respectively.

The same node names net0, net1, . . . net191 are assigned to the nodes corresponding to physical terminals wd0, wd1, wd2, . . . , wd63, bl0, . . . , bl63, Ibl0, . . . Ibl63 of each sub-circuit, respectively. This represents that the sub-circuits XI1 and XI2 are connected together via nodes net0, net1, . . . net191.

The memory array net list has the memory cell array information and the memory cell information similarly to the first embodiment.

The peripheral circuit block net list is formed of the physical property information about the elements of the peripheral circuit block and the interconnection parasitic elements as well as the information representing the connection relationship thereof.

(Operation)

Then, description will now be given on the operation of the net list producing device according to the third embodiment.

Figure 20:
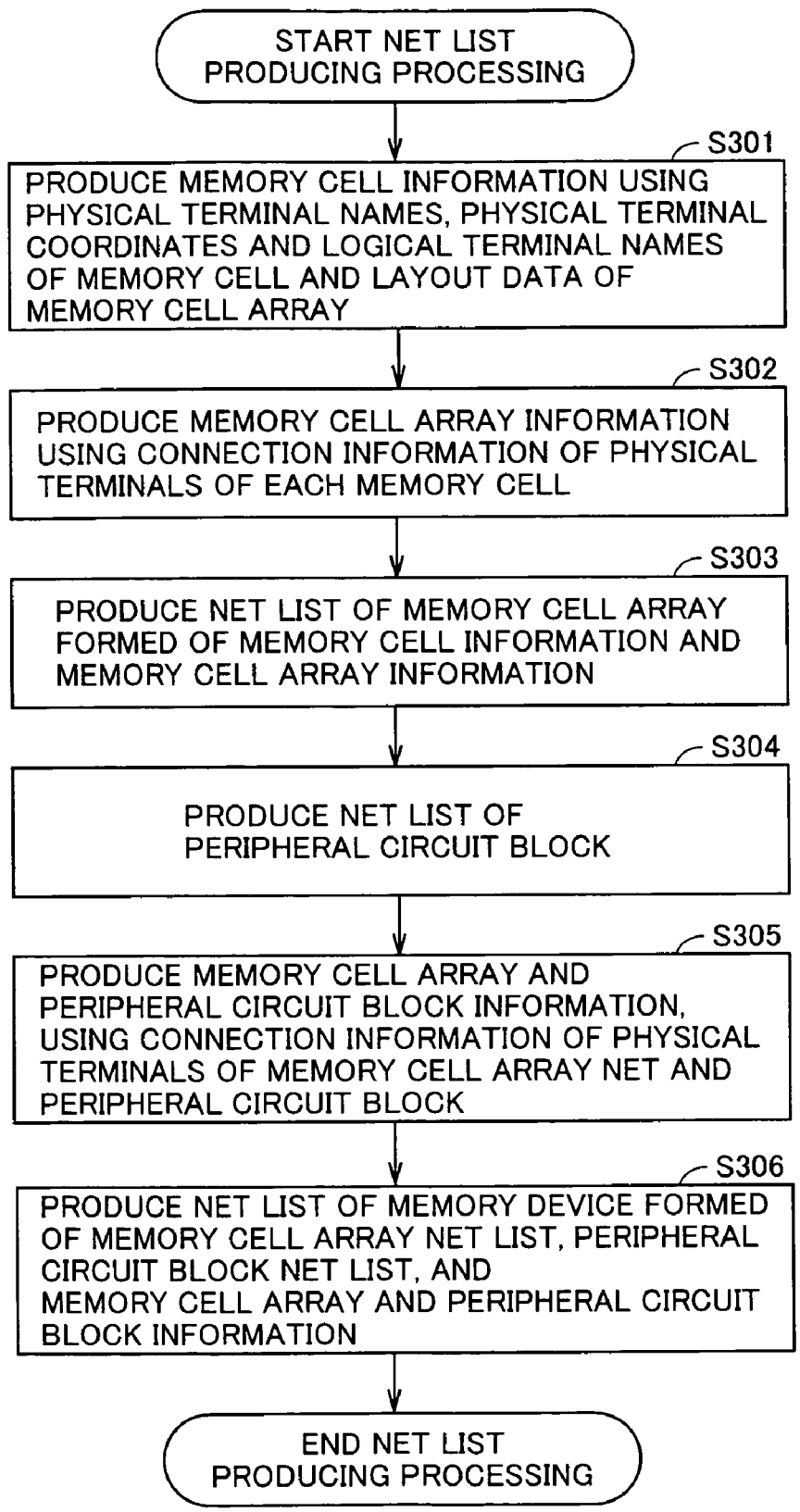
FIG. 20 is a flowchart illustrating operation steps of producing the net list of the memory device by the net list producing device according to the third embodiment.

FIG. 20 is a flowchart representing operation steps of producing the net list of the memory device by the net list producing device according to the third embodiment.

Memory cell information producing unit 2 obtains the layout data from the layout device, obtains the physical terminal coordinates, physical terminal names and logical terminal names of one memory cell forming the memory cell array from the memory array generator, and specifies, based on the data thus obtained, the parasitic elements formed of the resistance components (R) and the capacity components (C) parasitic on the interconnections of the memory cells, assuming that the single memory cell is arranged. Memory cell information producing unit 2 produces the memory cell information representing the physical quantities (e.g., resistance values and capacity values) of the elements forming the memory cell and the specified parasitic elements as well as the connection relationship between the elements (step S301).

Then, memory cell array information producing unit 4 obtains the connection information of the physical terminals of all the memory cells forming the memory cell array from the memory array generator, assigns, based on the connection information thus obtained, the same node name to the connected two physical terminals, and assigns the node names to the physical terminals of all the memory cells forming the memory cell array. Memory cell array information producing unit 3 produces the memory cell array information including the node names of all the memory cells forming the memory cell array (step S302).

Then, memory cell array net list producing unit 4 produces the net list of the memory cell array formed of the memory cell information and the memory cell array information (step S303).

Then, peripheral circuit block net list producing unit 32 produces the net list of the peripheral circuit block in an ordinary manner without performing hierarchical processing (step S304).

Memory cell array and peripheral circuit block information producing unit 34 obtains the connection information about the physical terminals of the memory cell array and the physical terminals of the peripheral circuit block from the memory array generator, and assigns, based on the connection information thus obtained, the node names to the physical terminals of the memory cell array and peripheral circuit block such that the same node name may be assigned to the connected two physical terminals. Memory cell array and peripheral circuit block information producing unit 34 produces the memory cell array and peripheral circuit block information formed of the node names of the memory cell array and the node names of the peripheral circuit block (step S305).

Then, memory device net list producing unit 33 produces the net list of the memory cell device formed of the net list of the memory cell array, the net list of the peripheral circuit block and the memory cell array and peripheral circuit block information (step S306).

As described above, the net list producing device according to the third embodiment can produce the net list of the memory device formed of the memory cell array formed of the repetition of the memory cell as well as the peripheral circuit block not having a repetition structure.

(Modification)

The invention is not restricted to the embodiments already described, and includes the following modifications.

Figure 21:
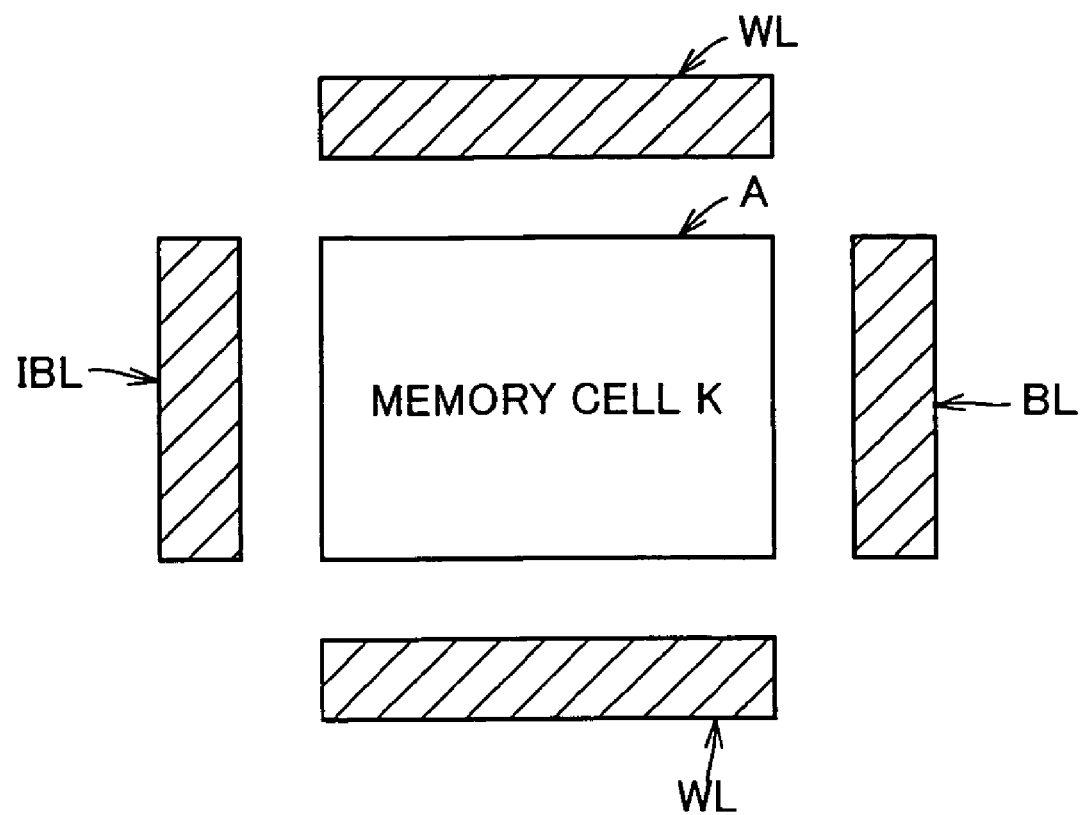
FIG. 21 illustrates a modification of the modification of the second embodiment.

(1) Specifying the parasitic elements caused by interconnections of surrounding memory cells FIG. 21 illustrates a manner of determining interconnection parasitic elements of the memory cell prepared by modifying the modification of the second embodiment.

In this modification illustrated in FIG. 21, it is assumed that the interconnections of the surrounding memory cells are grounded, similarly to the foregoing modification. However, this modification does not specify the parasitic elements caused by all the interconnections of the surrounding memory cells, but specifies only the parasitic elements caused by the interconnections closest to memory cell K in question among the surrounding memory cells.

More specifically, this modification specifies only grounded bit line IBL for a neighboring left memory cell, only grounded word line WL for a neighboring upper memory cell, only grounded word line WL for neighboring lower memory cell and only grounded bit line BL for neighboring right memory cell.

(2) Application to a circuit other than the memory cell array

The embodiments of the invention utilize the fact that the memory cell array is formed of the plurality of memory cells arranged in a repeating manner as shown in FIG. 1, and thereby produce the net list with the interconnection parasitic elements of the memory cell array by the hierarchical processing. However, this is not restrictive. In the case where the second circuit is formed of repetition of the first circuit, the net list producing device of the embodiment of the invention can produce the net list with the interconnection parasitic element of the second circuit.

(3) Circuit arrangement and layout

In the embodiments of the invention, each of net list producing devices 1, 11 and 31 is independent of the memory array generator and the layout device. However, this is not restrictive. Each of net list producing devices 1, 11 and 31 may include a circuit arranging unit executing the function as the memory array generator and a layout unit executing the function as the layout device.

(4) Program

Net list producing devices 1, 11 and 31 of the embodiments of the invention are not restricted to the devices formed of dedicated hardware. Net list producing devices 1, 11 and 31 may be configured to execute the functions of various components thereof by executing programs by computers.

(5) Net list of peripheral circuit block

The net list of the peripheral circuit block may be produced in a manner similar to that of producing the memory cell information. More specifically, peripheral circuit block net list producing unit 32 obtains the layout data from the layout device, may obtain the physical terminal coordinates, physical terminal names and logical terminal names of the peripheral circuit block from the memory array generator, and specifies, based on the data thus obtained, the parasitic elements which are formed of resistance components (R) and capacity components (C) parasitic on the interconnections of the peripheral circuit block. Thus, peripheral circuit block net list producing unit 32 assigns the physical terminal name to the position of the layout data corresponding to the obtained physical terminal coordinate, and specifies the interconnection parasitic element based on the layout data relating to the interconnection represented by the logical terminal name. By assigning the physical terminal name in this manner, it is possible to specify the position of the peripheral circuit block before extraction of the interconnection parasitic element.

Peripheral circuit block net list producing unit 32 produces the net list of the peripheral circuit block representing the physical quantities (e.g., resistance values and capacity values) of the elements forming the peripheral circuit block and the specified parasitic elements as well as the connection relationship between the elements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A net list producing device for producing a net list with interconnection parasitic element of a second circuit formed of repetition of a first circuit comprising:
    a first circuit information producing unit obtaining a physical terminal coordinate, a physical terminal name and a logical terminal name of said first circuit and layout data, and operating, based on said obtained physical terminal coordinate, said obtained physical and logical terminal names and said obtained layout data, to specify a parasitic element parasitic on an interconnection of said first circuit, and to produce first circuit information including said physical terminal name and representing physical properties and a connection relationship of an inner element of said first circuit and said parasitic element;
    a second circuit information producing unit obtaining connection information determining a connection relationship of physical terminals of all of said first circuits included in said second circuit, assigning node names to the physical terminals of all of said first circuits included in said second circuit based on said connection information, and producing second circuit information representing node names of all of said first circuits included in said second circuit; and a second circuit net list producing unit producing a net list of said second circuit formed of said first circuit information and said second circuit information.

2. The net list producing device according to claim 1, wherein said first circuit is a memory cell, and said second circuit is a memory cell array formed of repetition of said memory cell.

3. The net list producing device according to claim 2, wherein said first circuit information producing unit specifies parasitic elements of interconnections of said memory cell including parasitic elements occurring with respect to the interconnection of said memory cell and interconnections of memory cells surrounding said memory cell.

4. The net list producing device according to claim 3, wherein said first circuit information producing unit specifies the parasitic element of the interconnection of said memory cell assuming that the interconnections of said surrounding memory cells are grounded.

5. The net list producing device according to claim 2, further comprising:

a peripheral circuit block net list producing unit producing a net list of a peripheral circuit block of said memory cell array;

a memory cell array and peripheral circuit block information producing unit obtaining connection information determining a connection relationship between the physical terminals of said memory cell array and said peripheral circuit block, assigns, based on said obtained connection information, the node names to the physical terminals of said memory cell array and said peripheral circuit block, and produces memory cell array and peripheral circuit block information representing the node names of said memory cell array and said peripheral circuit block; and a memory device net list producing unit producing a net list of a memory device formed of the net list of said memory cell array, the net list of said peripheral circuit and said memory cell array and peripheral circuit block information.

* * * * *